US007929052B2

(12) United States Patent
Chen et al.

(10) Patent No.: US 7,929,052 B2
(45) Date of Patent: Apr. 19, 2011

(54) CAMERA MODULE

(75) Inventors: Ying-Lin Chen, Taipei Hsien (TW);
Yung-Chou Chen, Taipei Hsien (TW);
Wen-Chang Chen, Taipei Hsien (TW)

(73) Assignee: Hon Hai Precision Industry Co., Ltd.,
Tu-Cheng, New Taipei (TW)

( * ) Notice: Subject to any disclaimer, the term of this patent is extended or adjusted under 35 U.S.C. 154(b) by 392 days.

(21) Appl. No.: 12/061,883

(22) Filed: Apr. 3, 2008

(65) Prior Publication Data
US 2009/0109327 A1 Apr. 30, 2009

(30) Foreign Application Priority Data
Oct. 24, 2007 (CN) .......................... 2007 1 0202240

(51) Int. Cl.
*H04N 5/225* (2006.01)
(52) U.S. Cl. ...................................... 348/374
(58) Field of Classification Search ............ 348/374
See application file for complete search history.

(56) References Cited

U.S. PATENT DOCUMENTS

| 6,791,076 | B2 | 9/2004 | Webster |
| 7,664,390 | B2* | 2/2010 | Cho et al. ..................... 396/542 |
| 2004/0222352 | A1* | 11/2004 | Nishizawa ................. 250/208.1 |
| 2004/0223072 | A1* | 11/2004 | Maeda et al. ................ 348/340 |
| 2005/0212947 | A1* | 9/2005 | Sato et al. .................... 348/340 |
| 2005/0285973 | A1* | 12/2005 | Singh et al. .................. 348/374 |
| 2006/0234767 | A1* | 10/2006 | Nishikawa et al. ........ 455/556.1 |

FOREIGN PATENT DOCUMENTS

| JP | 2004260357 A | 9/2004 |
| TW | 562151 | 11/2003 |

* cited by examiner

*Primary Examiner* — James M Hannett
(74) *Attorney, Agent, or Firm* — Andrew C. Cheng

(57) ABSTRACT

A camera module includes a lens module, an image sensor, and a circuit board. The image sensor module is disposed in an image side of the lens module. The circuit board is electronically connected with the image sensor module. The circuit board includes a receiving chamber defined therein. The receiving chamber receives the image sensor module. The lens module is mounted on the circuit board and covers the receiving chamber. The image sensor module is fixed in the receiving chamber that is defined in the circuit board therein. Therefore, a thickness of the camera module along the axis of the camera module is decreased and a volume of the camera module becomes thinner compare with the conventional camera module.

2 Claims, 4 Drawing Sheets

CAMERA MODULE

RELATED FIELD

The present invention relates to the art of package technology, and more particularly, to a small sized camera module.

BACKGROUND

Increased production volumes in digital image technology are not only due to the increasing popularity of conventional digital cameras, but also due to miniature fixed-focused digital cameras incorporated into various end products, such as mobile telephones (cellular telephones), personal digital assistants (PDA), and other electronic devices.

Referring to FIG. 4, a conventional camera module includes a lens module 21, an image sensor module 22 disposed in an image side of the lens module 21, and a circuit board 23. A receiving chamber 211 is defined in the lens module 21 and the image sensor module 22 is received in the receiving chamber 211. The lens module 21 and the image sensor module 22 are fixed on the circuit board 23.

In the camera module, the special receiving chamber 211 configured for receiving the image sensor module 22 is disposed in one side of the lens module 21. Therefore, a dimension of the camera module along an axis of the lens module must be large enough to accommodate the lens module thus limiting the extent of miniaturization of the camera module.

It is desired to provide a camera module which can overcome the above-described deficiencies.

SUMMARY

According to the present invention, a camera module includes a lens module, an image sensor, and a circuit board. The image sensor module is disposed at an image side of the lens module. The circuit board is electronically connected to the image sensor module for transmitting signals from the image sensor module. The circuit board includes a receiving chamber defined therein. The receiving chamber receives the image sensor module. The lens module is mounted on the circuit board and covers the receiving chamber.

Other novel features and advantages will become more apparent from the following detailed description when taken in conjunction with the accompanying drawings.

BRIEF DESCRIPTION OF THE DRAWINGS

The present invention is described in detail hereinafter, by way of example and description of preferred and exemplary embodiments thereof and with reference to the accompanying drawings, in which.

DETAILED DESCRIPTION OF THE PREFERRED EMBODIMENTS

A detailed explanation of a camera module according to an embodiment of the present invention will now be made with reference to the drawings attached hereto.

Figure 1:
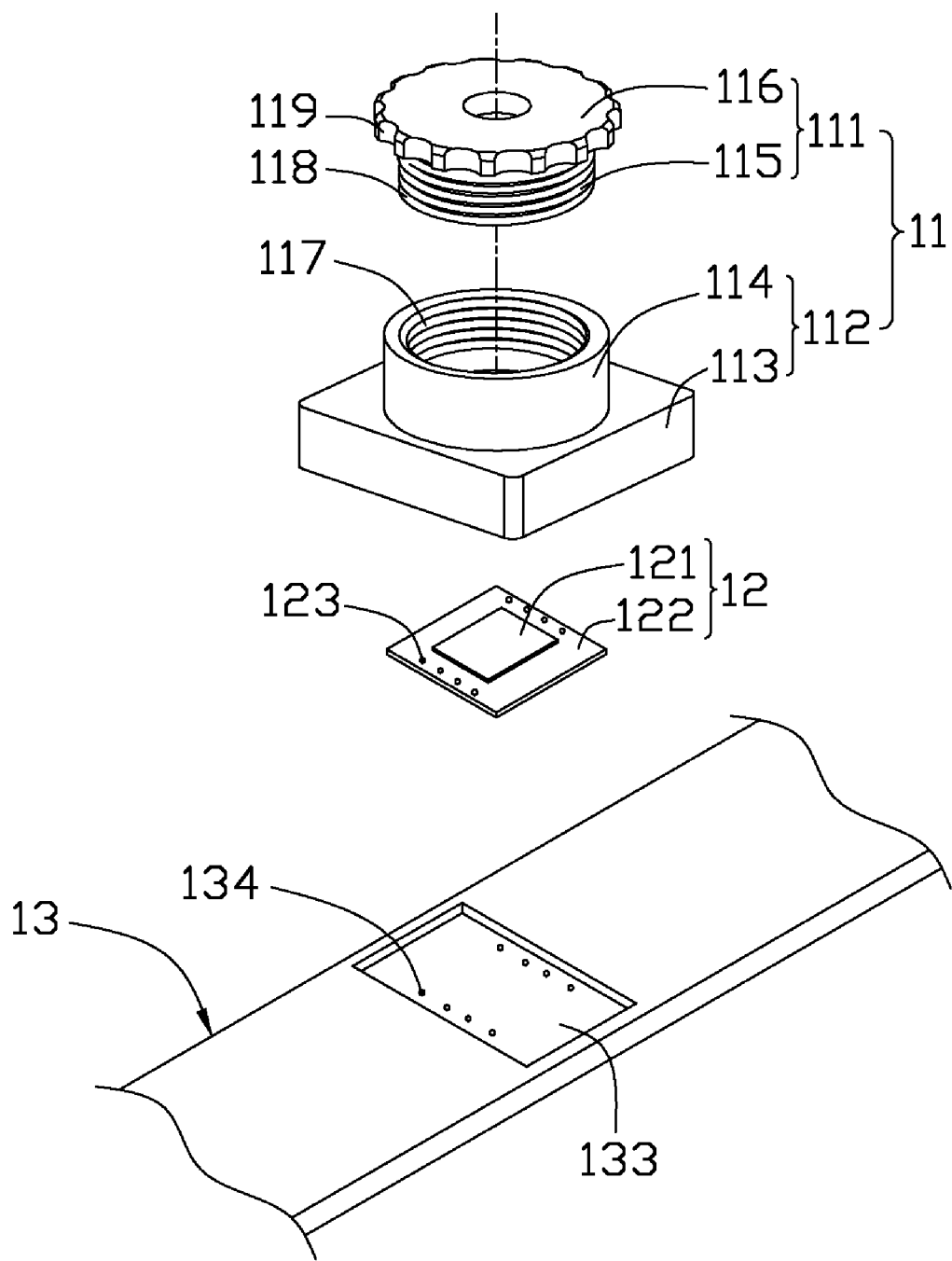
FIG. 1 is an isometric, exploded view of a camera module in accordance with the present invention.
Figure 2:
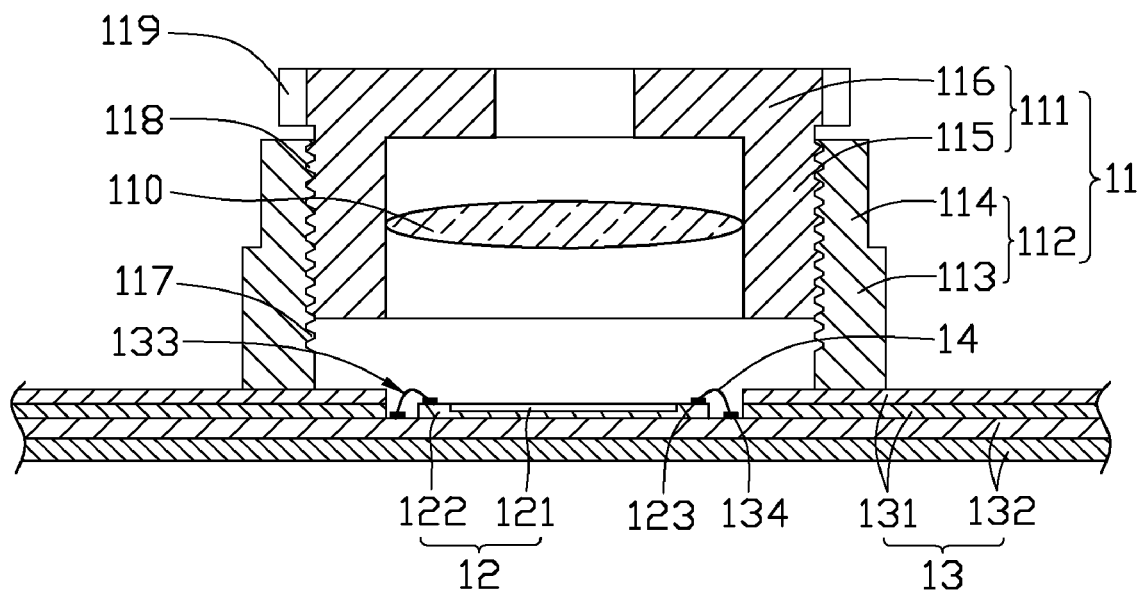
FIG. 2 is an isometric view of the assembled camera module of FIG. 1.
Figure 3:
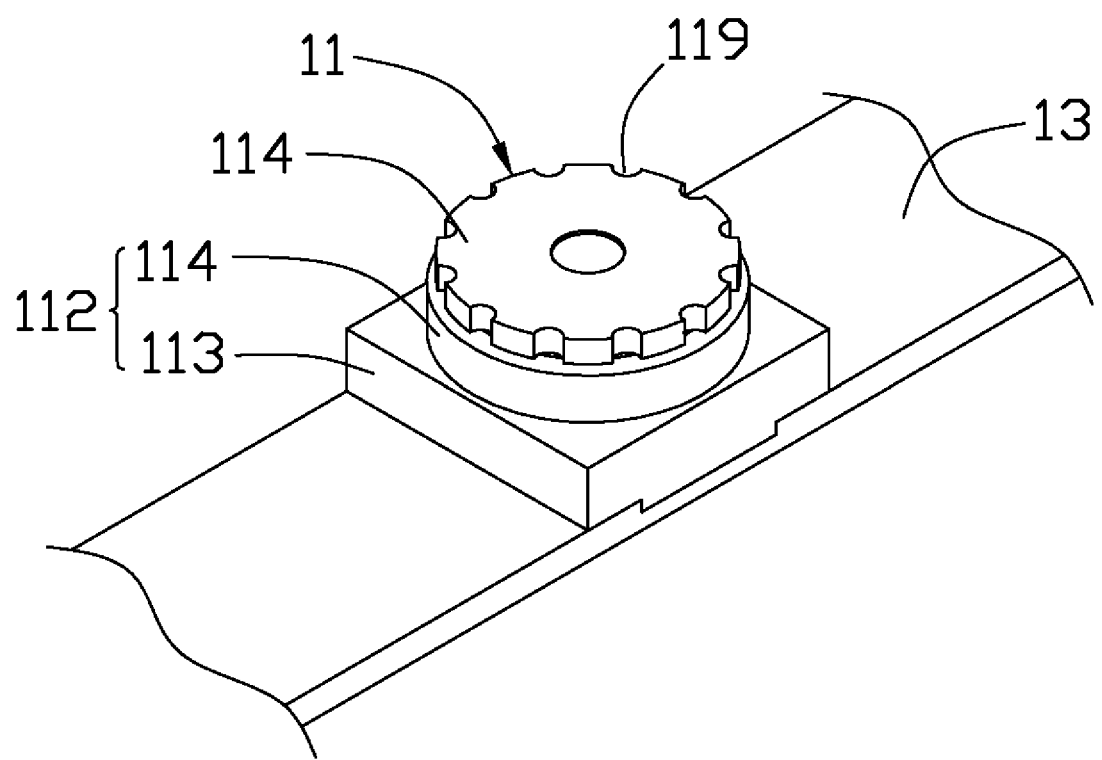
FIG. 3 is a schematic, cross-sectional view of the camera module of FIG. 2.
Figure 4:
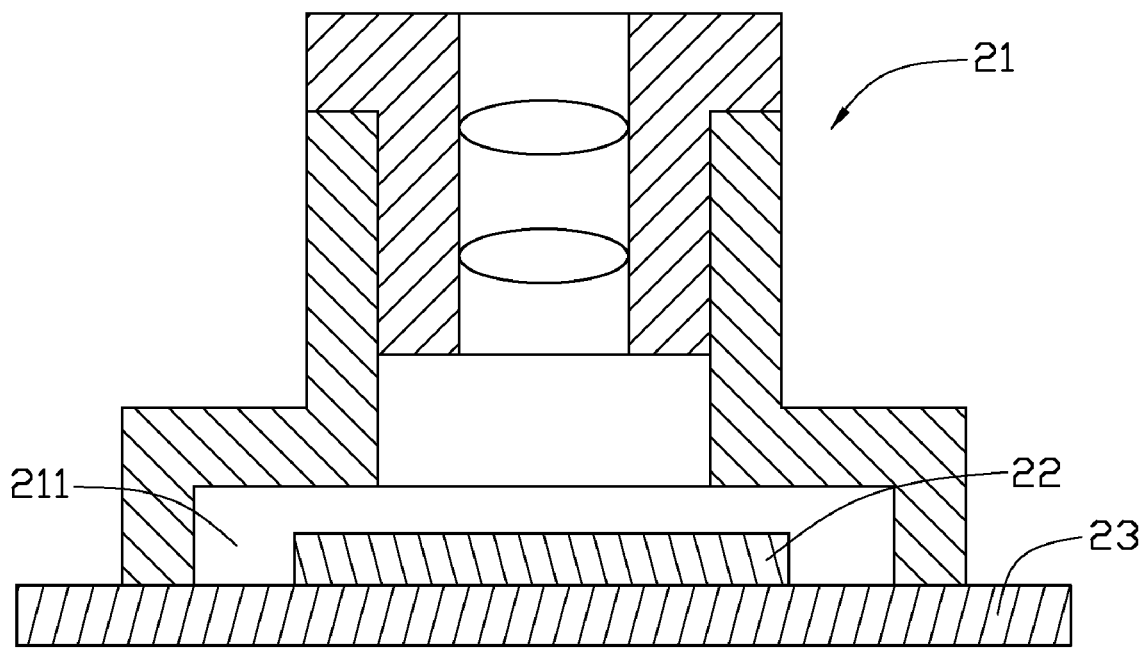
FIG. 4 is a cross-sectional view of a conventional camera module.

Referring to FIGS. 1-3, a camera module, for being used in a digital camera or some other electronic device, such as mobile telephone, PDA, cellular phone, etc, is shown. The camera module includes a lens module 11 configured for imaging, an image sensor module 12 disposed at an image side of the lens module 11, a circuit board 13 electronically connected to the image sensor module 12 for transmitting signals from the image sensor module 12, and a number of bonding wires 14 electronically connected with the image sensor module 12 and the circuit board 13.

The lens module 11 includes a barrel 111 configured for receiving at least an optical element 110 such as a lens, a spacer, and so on (only a lens is shown in FIG. 3), and a holder 112 connected to the barrel 111 via screws. The holder 112 includes a base portion 113 and an extension section 114. The base portion 113 has a rectangular structure and is connected to the circuit board 13. The extension section 114 has a columnar configuration, extends upwardly from the middle of the base portion 113, and defines an inner screw thread 117 therein. The barrel 111 defines a first annular portion 115 and a second annular portion 116 connected to an end of the first annular portion 115. The first annular portion 115 defines an outer screw thread 118 configured for engaging with the inner screw thread 117 of the holder 112. The first annular portion 115 is hollow or tubular in order to receive the optical element 110 therein. The second annular portion 116 defines a number of teeth 119 consistently spaced about the periphery of the second annular portion 116.

The image sensor module 12 includes an image sensor 121, a base 122 configured for supporting the image sensor 121 and electrically connecting to the image sensor 121 and a plurality of out pads 123 disposed on a surface of the base 122 and surrounding the image sensor 121. The image sensor module 12 is configured for capturing images and converting the images into digital data that can be processed by a processor (not shown). The outer pads 123 are connected to the circuit board 13, and configured for transmitting the digital data.

The circuit board 13 includes at least a flexible board and at least a stiff board. In the present embodiment, the circuit board 13 includes two stiff boards 131 and two flexible boards 132. A receiving chamber 133 is defined in the circuit board 13 and configured for receiving the image sensor module 12. A plurality of pads 134 are disposed on the bottom of the receiving chamber 133 and electrically connected to the outer pads 123 of the image sensor module 12 via a plurality of bonding wires 14.

In assembly, firstly, the image sensor module 12 is adhered to the receiving chamber 133 and the outer pads 123 are connected to the pad 134 of the circuit board 13 via the bonding wires 14. Then, the holder 112 of the lens module 11 is directly placed on the receiving chamber 133 via an adhesive (not shown). And so, the mini sized camera module is achieved.

As described above, the image sensor module 12 is fixed in the receiving chamber 133 which is defined in the circuit board 13 therein. Therefore, the thickness of the camera module along the axis of the camera module is decreased and thus the volume of the camera module decreases as well, compared with the conventional camera module.

It should be understood that the above-described embodiment is intended to illustrate rather than limit the invention. Variations may be made to the embodiments without departing from the spirit of the invention. Accordingly, it is appropriate that the appended claims be construed broadly and in a manner consistent with the scope of the invention.

What is claimed is:

1. A camera module, comprising:
a lens module;
an image sensor module disposed at an image side of the lens module; and
a circuit board electronically connected with the image sensor module for transmitting signals from the image sensor module and comprising two flexible boards and two stiff boards being disposed on the two flexible boards, a receiving chamber defined in the two stiff boards for receiving the image sensor module therein, the lens module being mounted on the circuit board and covering the receiving chamber.

2. The camera module as claimed in claim 1, wherein the circuit board comprises a plurality of pads disposed in the bottom surface of the receiving chamber and configured for transmitting signals from the image sensor.

\* \* \* \* \*